United States Patent [19]
Esterlis

[11] Patent Number: 5,496,459
[45] Date of Patent: Mar. 5, 1996

[54] APPARATUS FOR THE TREATING OF METAL SURFACES

[75] Inventor: Moisei Esterlis, Beer-Sheva, Israel

[73] Assignee: El-Plasma Ltd., Israel

[21] Appl. No.: 210,885

[22] Filed: Mar. 18, 1994

Related U.S. Application Data

[62] Division of Ser. No. 24,624, Mar. 1, 1993, Pat. No. 5,393,575.

[30] Foreign Application Priority Data

| Mar. 3, 1992 | [IL] | Israel | 101131 |
| Apr. 16, 1992 | [IL] | Israel | 101610 |

[51] Int. Cl.⁶ .................................. C23C 14/22
[52] U.S. Cl. ................. 204/298.41; 118/723 VE; 204/192.38
[58] Field of Search ............ 204/192.38, 192.1, 204/298.41; 219/121.36, 121.4, 121.43, 121.58; 118/723 VE, 723 HC

[56] References Cited

U.S. PATENT DOCUMENTS

| 4,492,845 | 1/1985 | Kljuchko et al. | 204/298,41 X |
| 4,505,948 | 3/1985 | Pinkhasov | 204/192.39 X |
| 4,536,640 | 8/1985 | Vukanovic | 204/298.41 X |
| 4,620,913 | 11/1986 | Bergman | 204/298.41 X |
| 5,026,466 | 6/1991 | Wesemeyer et al. | 204/298.41 X |
| 5,037,522 | 8/1991 | Vergason | 204/298.41 |
| 5,269,898 | 12/1993 | Welty | 204/298.41 |
| 5,277,714 | 1/1994 | Tamagaki | 204/298.21 X |

*Primary Examiner*—Nam Nguyen
*Attorney, Agent, or Firm*—Leonard Bloom

[57] ABSTRACT

An apparatus for the surface treatment of a metal workpiece which involves-the generation between a major exposed portion of an anode and successive restricted areas of a first surface of the workpiece serving as a cathode, a vacuum arc discharge having an arc current which is not substantially less than 50 amp. and having a positive voltage-current gradient.

15 Claims, 8 Drawing Sheets

APPARATUS FOR THE TREATING OF METAL SURFACES

CROSS REFERENCE TO RELATED APPLICATION

The instant application is a divisional application of U.S. patent application Ser. No. 08/024,624, filed Mar. 1, 1993, now U.S. Pat. No. 5,393,575 the contents of which are incorporated herein in their entirety.

FIELD OF THE INVENTION

This invention relates to the treatment of metal surfaces such as the cleaning (for example, the removal of scale, oxidized layers, contaminants and the like) of such surfaces, the thermal treatment and the coating thereof. The present application is a divisional to U.S. patent application Ser. No. 024,624 filed Mar. 1, 1993 (priority Mar. 3, 1992 and Apr. 16, 1992) now U.S. Pat. No. 5,393,575.

BACKGROUND OF THE INVENTION

The treatment of metal surfaces for the purposes of cleaning, and so as to allow for the subsequent treatment and coating, preferably by vaporization of the thus cleaned and treated surfaces, have long been known and various mechanical and/or chemical means have been proposed to carry out this cleaning.

It has been found in many cases, and in many applications, that such mechanical and/or chemical cleaning processes are either ineffective in achieving the required degree of cleaning, or involve the use of expensive and complicated equipment and may, in fact, give rise to damage to the surfaces being treated.

It has been proposed to clean the surface of a metallic object by subjecting it to a vacuum arc discharge wherein the metallic object constitutes an effective cathode. Such proposals have, for example, been made in U.S. Pat. No. 4,534,921, British Patent Specification No. 2086788 and in a paper by V. E. Bulat and M. Kh. Esterlis— "Removing Scale, Oxide Films and Contaminants from Metal Components by Vacuum Electric Discharge", Fizika i Khimiya Obrabotki Materialov, Vol. 21, No. 3, 1987, pp 49–53.

In this paper, it was explained that such a vacuum arc discharge takes place between the anode and discrete locations on the cathode known as cathode spots, and that these spots move at random on the surface of the cathode. The phenomenon of the production of cathode spots in vacuum arc discharges in general has been described in detail in "Vacuum Arcs: Theory and Application, J. M. Lafferty, Editor; Wiley 1980".

The nature and characteristics of the cathode spots in vacuum arc discharges have been described in some considerable detail in "The treatment of metal objects by electric erosion" by I. Nikoshevitz, Nauka Technico, Minsk 1988. In this book it is suggested that the cathode spots can be considered as falling into two main categories, namely:

(a) spots having a mean diameter of more than 1 mm and which travel at a mean speed which is less than 100 cm per second—such spots being hereinafter referred to as "large, slow-moving (LS)" cathode spots, and (b) spots having a diameter of less than 1 mm and travelling at a speed greater than 100 cm per second— such spots being hereinafter referred to as "small, fast-moving (SF)" cathode spots.

These characteristics of size and movement of the cathode spots has also been investigated inter alia by the present inventor, and this in the context of the voltage current characteristics of the vacuum arc discharge. Thus, it has been shown that the voltage current characteristic can consist of successive rising and descending portions, i.e. portions having positive and negative gradients. The inventor has shown that in the initial stages of the arc discharge, and with a small anode-cathode spacing, the arc extends from a single or a very limited number of cathode spots to a very limited area of the anode. Increasing the arc current is accompanied by an increase in the arc resistance and, as a result, it is accompanied by an increase in the arc voltage. In consequence, in this initial stage of the arc discharge the arc voltage current characteristic has a positive gradient.

When, however, as a consequence of further increase of arc current, the number of cathode spots increases and, as previously indicated, they move randomly around the entire cathode surface, the volume of the arc increases substantially and, as a consequence, the vapor density in the arc decreases significantly and with it the arc resistance. As a consequence, the arc voltage current characteristic passes into a negative gradient portion.

If now, however, the vapor density in the arc rises beyond a specific critical value, for example by a continued increase in the arc current and consequent increase vaporization of the cathode surface, it has been shown that the arc voltage current characteristic passes once more into the positive gradient region.

It has furthermore been shown, inter alia by the present inventor, that passage of the voltage current characteristic from the negative gradient portion to the positive gradient portion can be achieved by ensuring that the volume of the arc discharge, or its cross-sectional area, does not exceed a certain critical value seeing that this carries with it the consequence that the vapor density in the restricted arc volume is relatively high. In other words, this transition from the negative to the positive gradient for the voltage current characteristic is achieved with increasing arc current whilst maintaining the arc cross-section substantially constant or being reduced.

Now in view of the fact that the action of the arc on the surface to be treated takes place invariably in the region of the cathode spot, the fact that the cathode spots move randomly over the surface to be treated must give rise to a non-uniform treatment of the surface.

An attempt to overcome these problems arising out of the random movement of the cathode spots on the cathode surface is described in European Patent Application No. 0 468 110 A1, wherein there are disclosed means for directing the movement of the cathode spots on the cathode surface in a desired direction. It is, however, repeatedly stressed in the European patent application that the arc which is generated has a voltage current characteristic having a negative gradient and it is furthermore clear that these negative gradients arise in view of the fact that the mode of applying the arc voltage between the cathode and anode is such that the arc occupies a maximum volume with a correspondingly maximum cross-sectional diameter.

It has now been discovered that treating a cathode surface with an arc discharge having such negative gradient voltage current characteristics carries with it certain distinct disadvantages, among which are the facts that the treatment is time-consuming and uneconomical.

The present invention, on the other hand, is based on the surprising discovery that when the surface to be treated is subjected to a vacuum arc discharge having a positive voltage current gradient and with an arc current sufficiently high (greater than 50 amperes), an increased efficiency of surface treatment of the cathode surface can be achieved.

BRIEF SUMMARY OF THE INVENTION

According to the present invention there is provided an apparatus for carrying out the method for the surface treatment of a metal workpiece wherein there is generated between a major exposed portion of an anode and successive restricted areas of a first surface of said workpiece acting as a cathode, a vacuum arc discharge having an arc current which is not substantially less than 50 amp. and having a positive voltage-current gradient.

In accordance with the present invention, it is ensured that the arc is maintained, for as long as is necessary, in a stable regime and that there are created in each restricted area a significant number of LS cathode spots. Because of their relatively large size and slow movement, they are more effective in uniformly treating, for example, cleaning that restricted area before a succeeding restricted area is exposed to the discharge. By ensuring that the arc is generated between the restricted area and a major exposed portion of the anode, undesirable fusion of the anode (which would take place if the discharge were concentrated on a small area of the anode) is avoided. By imparting a relative movement between the workpiece and the anode, and by ensuring that there is a minimal spacing between the anode and the restricted area between which and the anode the arc discharge is to be established, it is ensured that successive restricted areas of the workpiece are treated, for example cleaned, and in this way a uniform treatment or cleaning of the entire surface of the workpiece is achieved.

In order to ensure that the arc discharge between the anode and the particular restricted area disposed at a minimum distance therefrom has a positive voltage current gradient, it is preferably arranged that each restricted area associated at that time with the arc discharge is associated with a low resistance region of the workpiece. This can be achieved, for example, by ensuring that the arc voltage is applied to a second and opposite surface of the workpiece by one or more contacts which define a particular surface portion, the portion being opposite and substantially coextensive with the particular restricted area. Alternatively, that region of the workpiece associated with the particular restricted area can be cooled so as to create the low resistance region.

An alternative means of ensuring that the arc discharge is generated between the particular restricted surface area is by electromagnetically irradiating that area, thereby heating the area and causing a certain degree of thermionic emission which is conducive to the restriction of the arc to this area.

A still further means for ensuring that the arc is struck between the anode and the restricted surface area is to have juxtaposed with respect to the particular restricted area an electrically insulated body having elements thereof in electrical contact with the particular restricted area.

In all cases, by ensuring that the arc is struck exclusively between a specific restricted surface area and the anode, and that the arc voltage current characteristic displays a positive gradient with an arc current greater than 50 amps, the arc discharge is relatively highly concentrated in a minimal volume and there are formed on the restricted surface area a plurality of LS cathode spots which are particularly effective in uniformly and economically treating the particular restricted surface area.

It will be realized that whilst LS cathode spots are concentrated in the particular restricted surface area being treated SF spots are also produced. In order to ensure that these SF cathode spots move in a predetermined direction which is preferably in the direction of treatment of the workpiece, the generating voltage is additionally applied to the workpiece via one or more auxiliary contacts located downstream in respect of the given direction. Preferably between 85 to 95% of the total arc current flows through the restricted surface area with the remainder flowing through the auxiliary electrodes. Thus, whilst the specific restricted area is being effectively treated by the LS cathode spots, a downstream region is being subjected to SF spots. These SF spots are effective in providing a preliminary surface treatment to that area of the workpiece between the specific restricted area and the region of the auxiliary contacts and in this way there is facilitated the subsequent, major treatment of the surface once the relative displacement of the workpiece with respect to the anode is effective in locating the restricted area in the region already preliminarily treated.

Where the surface treatment which has just been described is used for the preliminary cleaning of the workpiece, additional means may, as required, be provided for coating the workpiece by a vaporization technique. Thus, a vaporizing electrode can be included in the enclosure which can, for example, either be resistance heated so as to vaporize coating material for deposition on the workpiece after it has been preliminarily cleaned in the manner described above. Alternatively, additional arc discharge means can be provided for effectively heating the vaporizing electrode so as to cause its effective vaporization.

In order to ensure that the arc discharge is uniformly distributed around the exposed surface of the anode, it is proposed to form the anode of an outer and an inner body, the inner body having a higher electrical conductivity than the outer body, the arc voltage being applied between the workpiece and the inner body whilst the arc discharge being generated between the outer body and a restricted area of the workpiece. With the generation of the arc discharge, the region of the outer body associated with the discharge becomes heated, thereby increasing the electrical resistance thereof and the arc therefore automatically moves to a relatively cooler lower resistance region of the outer body, and in this way the arc is regularly distributed across the exposed surface of the outer body.

Preferably, the anode is of annular shape, thereby facilitating the uniform treatment of an elongated workpiece which is passed therethrough.

Preferably, in the case of treatment of flat surfaces the anode is formed of outer and inner substantially coaxial cylindrical bodies in close electrical contact, means being provided for imparting a continuous or intermittent rotational displacement to the anode.

BRIEF DESCRIPTION OF THE DRAWINGS

For a better understanding of the present invention, and to show how the same may be carried out in practice, reference will now be made to the accompanying drawings, in which.

DETAILED DESCRIPTION OF PREFERRED EMBODIMENTS

Figure 1:
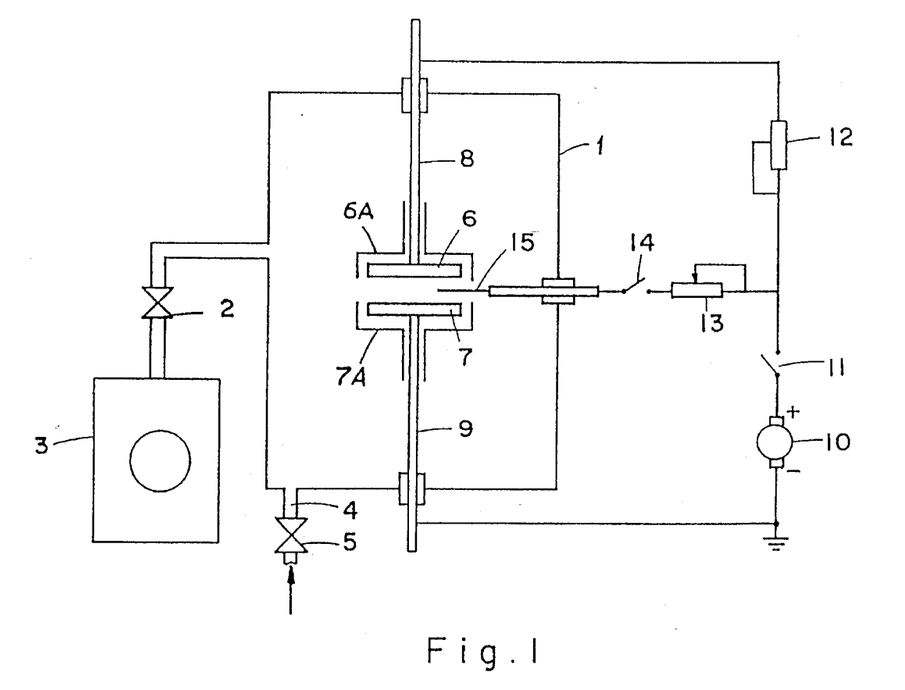
FIG. 1 is a schematic representation of the type of apparatus for surface treatment of a metal workpiece to which the basic concepts of the present invention are to be applied.
Figure 2:
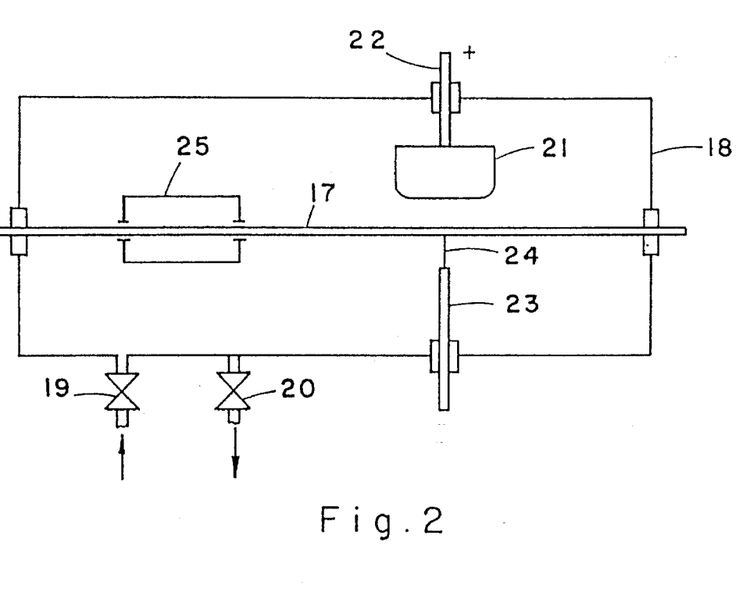
FIG. 2 shows schematically the use of a vacuum arc discharge in the progressive cleaning of an elongated article.

Reference will first be made to FIGS. 1 and 2 of the drawings, which shows schematically the type of apparatus for the surface treatment of a metal workpiece to which the basic concepts of the present invention are to be applied.

As seen in FIG. 1 of the drawings, the apparatus comprises an enclosure 1 communicating via an appropriate valve 2 with a vacuum pump 3 by means of which a suitable vacuum can be created in the enclosure 1. The enclosure 1 is furthermore provided with an inlet port 4 which communicates via a valve 5 with a source (not shown) of gases for introduction into the enclosure 1. An anode 6 is juxtaposed with respect to a cathode 7 (the latter schematically representing the workpiece to be treated) and they are respectively provided with electric conductors 8, 9 which extend sealingly through the housing 1. An electric supply source 10 is connected via a switch 11 and a resistor 12 across the conductors 8, 9 and in parallel via a resistor 13 and a switch 14 to a trigger electrode 15 whose tip is interposed between the anode 6 and the cathode 7.

With the housing 1 evacuated by means of the vacuum pump 3 and with the introduction of appropriate gases via the inlet port 4 at a suitably low pressure, the closing of the switches 11 and 14 results in the trigger electrode 15 triggering off an arc discharge between the anode 6 and the cathode 7, whereupon the switch 14 can be opened.

The action of the arc discharge which is established between the anode 6 and the cathode (workpiece) 7 is effective in carrying out surface treatment of the cathode such as, for example, the removal of scale therefrom. In order to ensure that the arc discharge is restricted to the opposed surfaces of the anode 6 and cathode 7, both electrodes are provided with suitable shields 6a and 7a.

FIG. 2 shows schematically the use of a vacuum arc discharge in the progressive cleaning of an elongated object 17 such as, for example, a pipe, a wire or a sheet. In this case, the elongated object 17 which passes sealingly through an evacuated housing 18 constitutes an effective cathode, the housing being provided with a valve-controlled gas inlet port 19 and a vacuum evacuation port 20.

An anode 21 is located above the elongated workpiece 17 and is provided with a conductor 22 which extends through the housing 18 to be connected to the positive pole of a voltage source (not shown). A further conductor 23 extends sealingly through the housing 18 and, at one end thereof, is coupled to the negative pole of the voltage source and, at the other end thereof, is coupled to a contact 24 which establishes electric contact with the object 17 whilst allowing for relative movement of the object 17 with respect to the contact 24. The object passes through an appropriate screen 25 whose function is to limit the spread of the arc discharge.

As previously explained, the establishment of a vacuum arc discharge between the anode and cathode, without taking special measures to restrict the arc discharge to restricted areas of the cathode surface, results in the production, over an expanded area of the cathode surface, of cathode spots which move about on the cathode surface in an entirely random manner and, in consequence, such an art discharge is not conducive to the uniform treatment of the cathode surface. Furthermore, as explained above, this operation of the arc discharge is characterized by having an arc voltage current characteristic having a negative gradient.

The present invention is based on the discovery that much more effective uniform treatment can be obtained when the arc discharge operates with its voltage current characteristic having a positive gradient and this with an arc current not less than 50 amperes and with the arc discharge substantially uniformly distributed over the exposed portion of the anode.

Furthermore, it was discovered that, in order to operate with such a positive gradient arc voltage current characteristic, it is necessary to limit the volume and in consequence the cross-section of the arc whilst increasing the arc current, and thereby increasing the vapor density in the arc with a consequent rise of resistance. This is achieved, in accordance with the invention, by arranging for the arc to be generated at any particular time between a major exposed portion of the anode and a restricted area of the workpiece. Furthermore, as previously indicated, one mode for arranging for the confining of the arc to such a restricted area is to create low resistance regions in the workpiece, which regions are respectively associated with the desired restricted areas.

Figure 3:
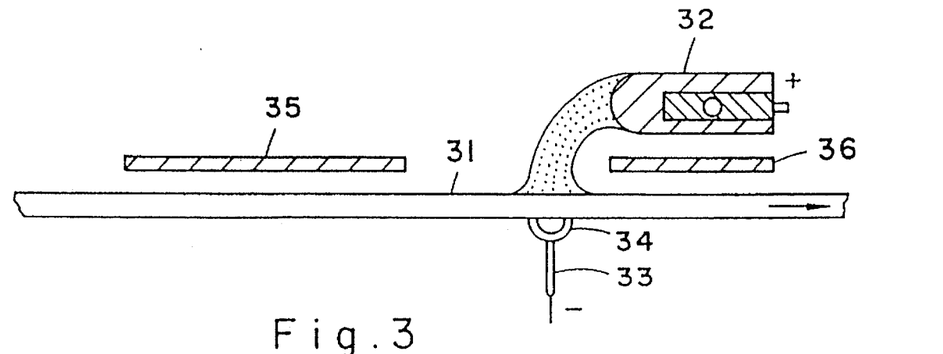
FIG. 3 shows schematically the application of one embodiment of an arc discharge in accordance with the invention.
Figure 4:
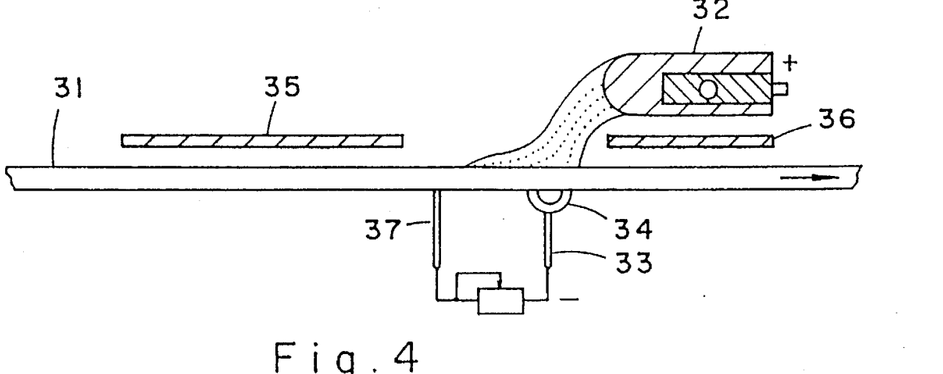
FIG. 4 shows schematically the application of a further form of arc discharge in accordance with the present invention.
Figure 5:
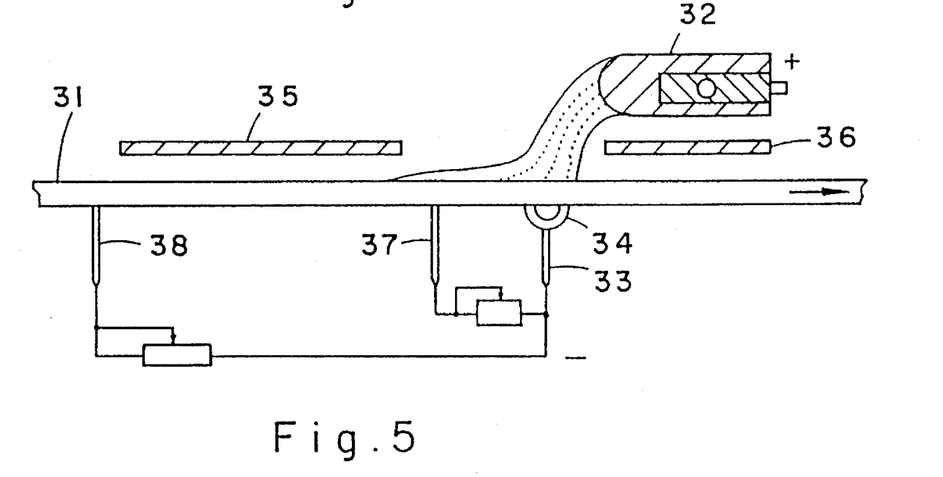
FIG. 5 shows schematically the application of a still further form of arc discharge in accordance with the present invention.

FIGS. 3, 4 and 5 show schematically how such restricted areas are formed by the creation of low resistance regions. Thus, as seen in FIG. 3 of the drawings, an elongated workpiece 31 which passes sealingly through an evacuated enclosure (not shown) constitutes a cathode which is juxtaposed with respect to an anode 32. The latter is connected to the positive pole of an electric voltage source (not shown).

The negative pole of the electric voltage source is electrically connected to the workpiece 31 via a conductor 33 and a multi-point contact 34, e.g. a ring-like contact, which contacts that surface of the workpiece 31 opposite the surface exposed to the anode. The region of the workpiece associated with the surface thereof defined by the multi-point contact 34 is essentially a low resistance region (as compared with the remaining portions of the workpiece) and this region will therefore be associated with a restricted surface area of the workpiece exposed to the anode. The arc discharge will preferably be created between this restricted surface area and the anode. Insulating screens 35, 36 are provided so as to ensure that arc discharges do not spread in undesirable directions. As can be seen, the arc discharge 37 which is generated between the major exposed portion of the anode and the restricted area opposite the multi-point contact 34 is of restricted cross-section and is effected in the region of the closest possible spacing between the workpiece and the anode.

By so confining the arc discharge to the restricted surface area, the vapor density in the arc discharge increases. As a consequence, the arc discharge voltage current characteristic has a positive gradient and it is found that there are formed on the restricted surface area a plurality of LS cathode spots which give rise to a uniform treatment, i.e. cleaning, of the restricted surface area. With the continuous or intermittent displacement of the workpiece 31 in the direction of the arrow, the 10 displacement taking place with reference to the fixed anode 32 and multi-point contact 34, successive restricted surface areas are displaced into the minimum distance region vis-à-vis the anode and are subjected to the action of the LS cathode spots which form thereon. Thus, successive restricted surface areas of the workpiece are treated and the workpiece surface as a whole is uniformly subjected to the action of the arc discharge. Thus, the direction of treatment of the workpiece is opposite the direction of relative displacement thereof vis-à-vis the anode.

It will be understood that, whilst LS cathode spots are formed on the restricted areas, significant numbers of SF cathode spots are generated and, if no steps were taken, these SF cathode spots which move out of the restricted surface area would move about at random on the workpiece surface. In order to control and direct the movement of these SF cathode spots, arrangements such as those shown schematically in FIGS. 4 and 5 of the drawings are adopted. Thus, for example, as shown in FIG. 4 the negative pole of the voltage supply is connected, in parallel with the multi-point contact 34, to a contact 37 upstream of the multi-point contact 34 with respect to the direction of relative displacement. By virtue of this arrangement it is found that, at the same time as the LS cathode spots are effectively treating the restricted surface area, the SF cathode spots move along the surface towards the contact 37, effecting a preliminary treatment of the region between the multi-point contact 34 and the contact 37. In this way there is facilitated the subsequent thorough treatment of this region by the LS spots once the movement of the workpiece will have brought the successive surface areas into the region of the arc discharge.

FIG. 5 shows a further elaboration of this idea, in which a further auxiliary contact 38 is connected in parallel with the multi-point contact 34 and the auxiliary contact 37 at a position still further upstream of the workpiece 31 with respect to the direction of relative displacement, thereby ensuring that even the fastest moving of the SF cathode spots are directed in a required, predetermined direction, thereby effecting preliminary treatment of the surface prior to the major treatment thereof by the major portion of the arc discharge.

Thus, in the case of the embodiments shown in FIGS. 3, 4 and 5 of the drawings, preliminary treatment (for example, cleaning) of the workpiece 31 will take place by virtue of the directed SF cathode spots and final treatment will be effected by means of the LS cathode spots.

In practice, it is recommended that between 85%–95% of the total arc current at any time flows through the multi-point contact which creates the restricted surface area being treated, whilst between 5%–15% of the total current flows through the auxiliary electrodes.

Figure 6:
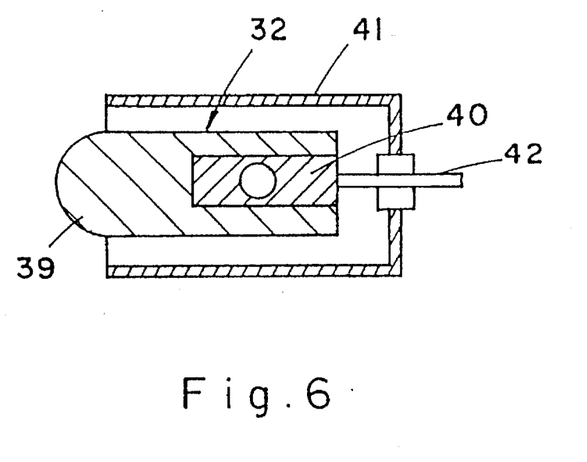
FIG. 6 shows on an enlarged scale a cross-sectional view of an anode used in the arc discharge apparatus in accordance with the present invention.

Reference will now be made to FIG. 6 of the drawings for a description of the construction of the anode 32. This anode comprises an outer body 39 in which is embedded an inner body 40. The anode 32 is surrounded, except for its front portion, by a screen 41 through which screen there extends insulatingly an anode contact 42 to be connected to a positive pole of a voltage source. Whilst the inner body 40 is formed of a highly conductive material such as, for example, copper, the outer body 39 is formed of a relatively less conductive high refractory material such as, for example, stainless steel, inconel or the like. With an anode constructed in this fashion, the portion of the surface of the main body 39 of the anode acted on by the arc discharge heats up and, as a result, the electric resistance therein increases and the arc automatically shifts to another portion of the surface of the anode which has remained cooler, seeing that this portion exhibits a lower resistance path to the inner body 40. This procedure continues, resulting in the continued uniform distribution of the arc discharge over the exposed surface of the anode and thereby reducing the likelihood of the fusion of the anode and contributing to its relatively long durability. As can be seen, the inner body 40 is apertured for the passage therethrough of a cooling fluid, thereby enhancing the cooling of those portions of the outer body 39 which at any particular instant are not being heated by the arc discharge.

Figure 7:
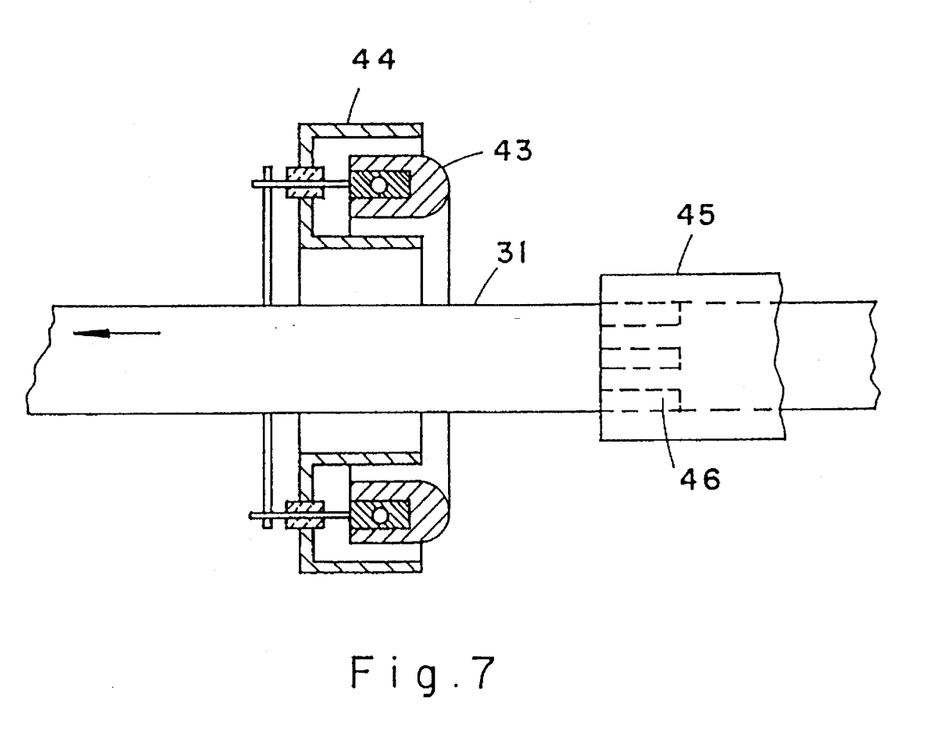
FIG. 7 shows schematically a portion of a further form of anode, together with a moving workpiece, all in accordance, with the present invention.

In the embodiment shown in FIG. 7 of the drawings, an annular anode 43 is located within an annular screen 44 with the elongated workpiece 31 displaceable in the direction of the arrow, through the annular screen 44 and annular anode 43. If now the workpiece is rotated about its longitudinal axis within and with reference to the anode 43 and, at the same time, the workpiece 31 is displaced axially through the anode 43, the treated restricted surface areas will form an effective spiral path about the workpiece 31 with the resulting effective surface treatment of the entire workpiece 31.

The example just given is just one of various examples in which restricted surface areas are generated in a direction substantially normal to the direction of displacement of the workpiece as a whole.

As can be seen in FIG. 7 of the drawings, the workpiece is provided with a sleeve-like screen 45 designed to limit the regions of the workpiece between which and the anode the arc discharge can extend. On the other hand, as can be seen, the screen 45 is provided with narrow, elongated slots 46 allowing for the entry of SF cathode spots through these slots onto upstream portions of the workpiece with respect to the direction of displacement of the workpiece, so as to facilitate their treatment.

Figure 8:
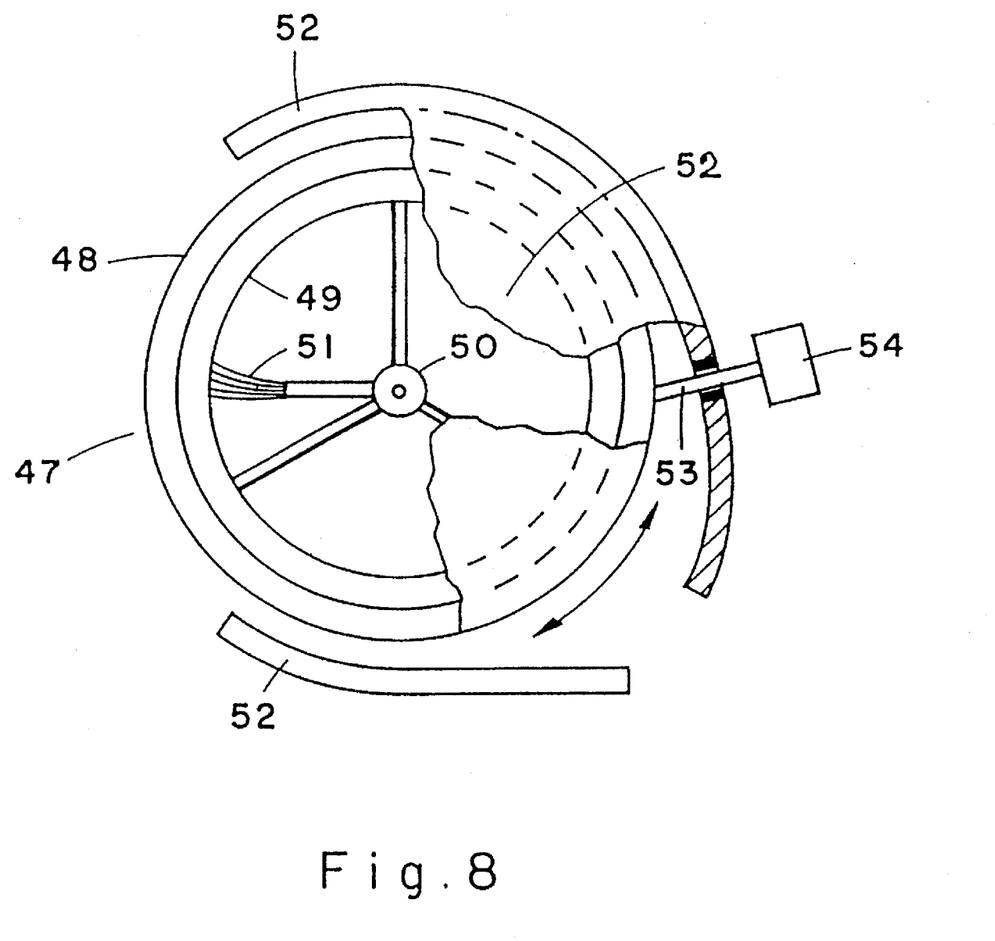
FIG. 8 is a side elevation of a further form of anode for use in an arc discharge apparatus in accordance with the invention.

In the embodiment shown in FIG. 8 of the drawings, designed specially for use with extended sheet-like workpieces, a cylindrical anode 47 is provided. The anode 47 comprises an outer tubular member 48 made of a high refractory material and an inner tubular member 49 made of a very low resistance material. The anode 49 is rotatable (either continuously or intermittently) about a central axle through which a cooling fluid can flow and which also serves as an electrical conductor by means of which and a conductive brush 51 the anode can be connected to a voltage supply (not shown). The anode 47 is furthermore provided with surrounding screens 52 serving to limit the spread of the arc discharge.

Extending through the screen 52 is a scraper rod 53 having drive means 54 and which serves to detach from the anode surface accumulated evaporated or otherwise deposited materials.

Whilst in the arrangement just described the restricted surface areas are associated with low resistance regions generated by the multi-point contact with the workpiece, such low resistance areas can be created, for example, by cooling the particular regions associated with the restricted surfaces, thereby lowering their electrical resistance.

An alternative mode for generating the restricted surface areas between which and the anode the arc discharge is concentrated, is to irradiate these areas with appropriate electromagnetic radiation such as, for example, laser radiation. The consequent heating of these areas by the radiation results in a certain degree of vaporization and subsequent ionization which facilitates the arc discharge between these areas and the anode. It will be realized, however, that in order to counteract the heating of the workpiece region associated with these areas as a result of the radiation, the regions themselves should be additionally cooled.

A still further mode for ensuring the confining of the arc to a restricted surface area is to form fine indentations on the surface prior to or during the arc treatment and the presence of those indentations serve to restrict the movement of the LS cathode spots. These indentations can be formed initially along the longitudinal extent of the workpiece for the guiding of the SF cathode spots and normally thereto for the concentration of the LS cathode spots.

An alternative, or additional, mode for ensuring that the arc is confined to a region between a restricted surface area and an anode, is to position, adjacent the restricted surface area, an electrically insulated body having teeth thereof in successive electrical contact with the restricted area. The actual contact of these teeth with the restricted area of the workpiece and the movement of the workpiece with respect to these teeth gives rise to a degree of sparking which, in turn, results in the confining of the arc discharge to the restricted surface area in which sparking takes place. Additionally, the teeth are effective in trapping the cathode spots.

Figure 9:
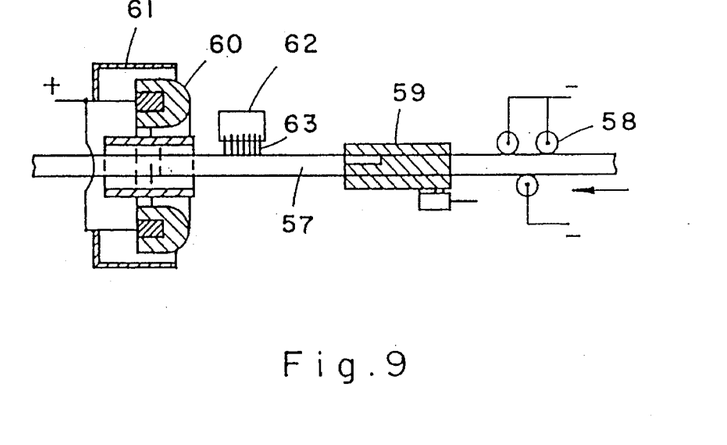
FIG. 9 is a schematic representation of a further embodiment of apparatus in accordance with the present invention, for treating an elongated moving object.

The use of such an electrically insulated body is schematically illustrated in FIG. 9 of the drawings. As seen in this figure, an elongated object 57, such as a wire or the like, is subjected to vacuum arc discharge cleaning. For this purpose, the object 57 is longitudinally displaced in good electrical contact with a plurality of conductive rollers 58 which are, in their turn, connected to the negative pole of a voltage source. The object 57 passes through a slotted, rotatable tubular screen 59 before passing through an annular anode 60 which, in its turn, is connected to the positive pole of the voltage source,. The anode 60 is provided with tubular screening 61 so as to prevent the generation of arc discharges in undesired portions of the workpiece 57 and the anode 60.

Juxtaposed with respect to the workpiece 57 and in close proximity with the anode 60 is an insulated body 62 from which depend electrically conductive teeth 63 which are in electrical contact with the object 57.

In operation, the contact of the teeth 63 with the moving object 57 traps the cathode spots and gives rise to sparking and, as a consequence, the sparking region becomes a restricted surface area between which and the anode 60 a relatively confined arc discharge is set up. The restricted area is effectively cleaned by the arc discharge. At the same time, the teeth 63 bearing on the object 57 and the continued displacement of the object 57 with respect to the teeth 63 give rise to a mechanical cleaning action which effectively supplements or completes the cleaning action effected by the arc discharge.

It will be realized that whilst the action of the teeth 63 on the surface of the object 57 serves to define the restricted surface area between which and the anode the main arc discharge is confined, significant numbers of SF cathode spots will tend to move in the direction of the rollers 58. By ensuring that the speed of displacement of the object 57 substantially equals the mean speed of displacement of these cathode spots in the opposite direction, it can be ensured that the bulk of the LS cathode spots remain substantially stationary, whilst those SF cathode spots which nevertheless proceed in the direction of the rollers 58 effect preliminary cleaning treatment of the object.

The mean speed of movement of the cathode spots V for an object having uniform scale thickness can be given by the relationship $$V = V_o \cdot e^{-kt}$$

where $V_o$ is constant for the material being treated (e.g. for steel $V_o = 10^2$ cm/sec)

k is an empirical coefficient=0.44 t is thickness of scale in μm.

Figure 10A:
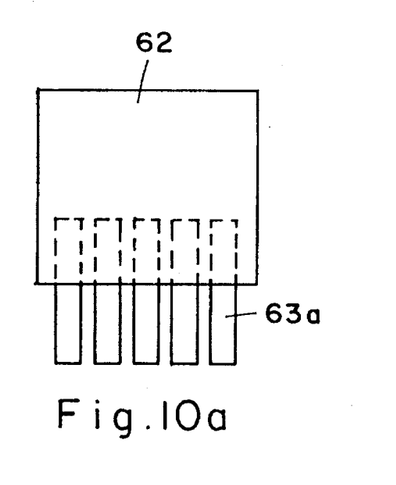
FIGS. 10a, 10b and 10c are views on an enlarged scale of differing variations of a detail of the apparatus shown in FIG. 9.
Figure 10B:
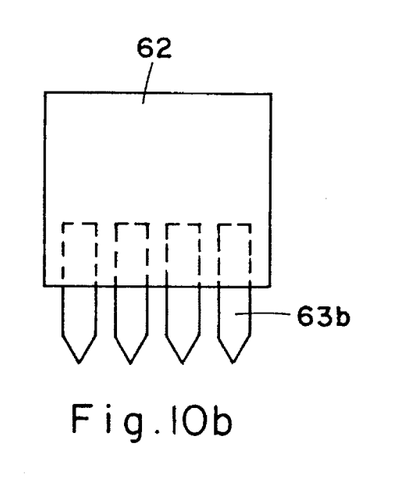
Figure 10C:
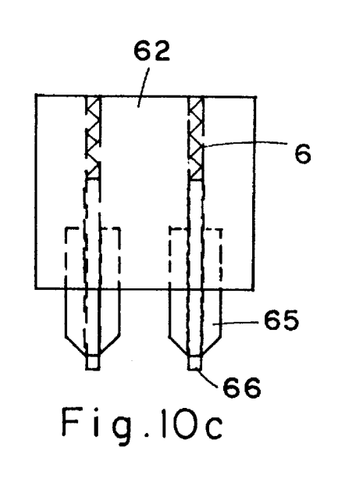

FIG. 10 of the drawings shows three alternative embodiments of the insulated body. As seen in FIG. 10a, the insulated body comprises an insulated holder 62 having a set of flat tipped teeth 63a. In the embodiment shown in FIG. 10b, the teeth 63b are, pointed. In the embodiment shown in FIG. 10c, the holder 62 is formed with teeth retainers 65 in which are fitted removable teeth 66 which are spring biased by springs 67 into contact with the object to be, treated. With this embodiment the teeth 66 can readily be replaced as required.

The teeth can, as indicated, be formed of an electrically conductive material or, alternatively, the teeth can be formed of an insulating material which can be rendered conductive by the deposition thereon of electrically conductive material. Preferably, the teeth are spaced apart by an amount (e.g. 0.5–5 mm) such as to trap the LS cathode spots and therefore to confine the arc.

Where the teeth are designed essentially for confining the arc and/or surface cleaning, they can be formed of any suitable electrically conductive, relatively hard, material. Where, however, and as to be explained in greater detail below, the teeth are designed for use for arc confining and/or the mechanical treatment of a coated surface, then the elements should be formed of a softer material such as, for example, the coating material or the material of the workpiece. The materials for the teeth can be chosen in accordance with the purpose of treatment.

The teeth can be employed in creating the indentations normal to the direction of treatment of the object whilst carrying out their other functions. These indentations serve to concentrate the LS cathode spots.

Figure 11:
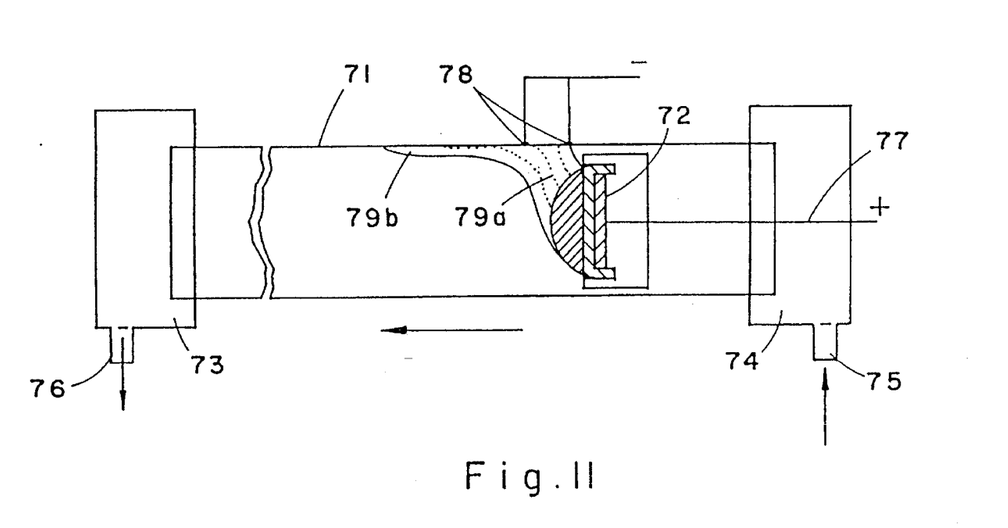
FIG. 11 is a schematic representation of a further form of apparatus in accordance with the invention, for the treatment of the inner surface of an elongated, tubular object.

There is illustrated in FIG. 11 of the drawings an alternative arrangement for the concentration of the LS cathode spots in the restricted surface areas and for the controlled movement of the SF cathode spots. In this arrangement, an elongated tubular object 71 such as, for example, a pipe is to have its inner surface treated for the purpose of cleaning by the generation of a vacuum arc discharge between an anode 72 and the inner surface of the object 71. In this arrangement, the object 71 is sealed at either end thereof by means of appropriate seals 73, 74. The object is suitably evacuated so as to generate a vacuum therein, whilst the sealing means 74 is provided with a gas inlet 75 and the sealing means 73 is provided with a gas outlet 76.

The anode 72 is coupled by coupling means 77 to the positive pole of a voltage source, which coupling means also serves for displacing the anode 72 axially through the object 71. In good electrical contact with the outer surface of the object 71 are a plurality of contacts 78 which, in their turn, are designed to be collected to the negative pole of the voltage source. The contacts 78 are arranged to be displaceable around the outer surface of the object 71 in a substantially spiral path from one end of the object adjacent the sealing means 74 to the opposite end of the object 71 adjacent the sealing means 73. The displacement of the contacts 78 is in synchronism with the axial displacement of the anode 72.

With a constant low gas pressure throughout the tubular object, i.e. with no gas flow therethrough from the in, let 75 to the outlet 76, an arc discharge 79a is concentrated between the anode 72 and the restricted surface area opposite the contacts 78. Under these circumstances, however, SF cathode spots will move at random over the remaining surface of the tubular object and do not therefore contribute to any desired preliminary treatment of the surface. With, however, a continuous gas flow through the tubular object from the inlet 75 to the outlet 76, a pressure gradient is built up in the tubular object, i.e. the pressure steadily reduces from the region of the inlet 75 to the outlet 76 and under these circumstances there is produced a tail portion 79b of the discharge, in which tail portion the SF cathode spots move in a predetermined direction, thereby giving rise to the preliminary treatment of the surface. This preliminary treatment facilitates the subsequent full treatment by virtue of the main discharge being between these pre-treated areas and the anode 72.

Whilst in the embodiments specifically described above the controlled movement of the SF cathode spots has been in the direction of treatment it can, as has been indicated, be arranged for this controlled movement to be substantially normal to the direction of treatment.

The maximum dimension (in a direction normal to the direction of treatment) of any treated zone (i.e. region of effective cathode spots) can range between 5–250 mm for a single arc. Where the object is being simultaneously treated by a plurality of arcs, the sum total of these maximum dimensions should lie within a range which is a sum of the individual ranges for each arc.

When, as described above, the apparatus is used for cleaning the surface of the workpiece, e.g. the removal of scale therefrom, the gas pressure in the vacuum chamber is chosen in accordance with the thickness of the scale to be removed. E.g.

with scale less than 1 μm thickness, a maximum gas pressure of about 100 PA is used;

with scale between 1–5 μm thickness, a maximum gas pressure of about 5 PA is used;

with scale greater than 5 μm thickness, a maximum gas pressure of about $5.10^{-1}$ is used.

The gas pressures can either relate to the residual air pressures or to any suitable gas pressure.

As indicated above, the method and apparatus in accordance with the present invention are of particular utility in connection with the coating by vaporization of metal surfaces. This particular application of the present invention will now be described with reference to FIGS. 12 through 15 of the accompanying drawings.

Figure 12:
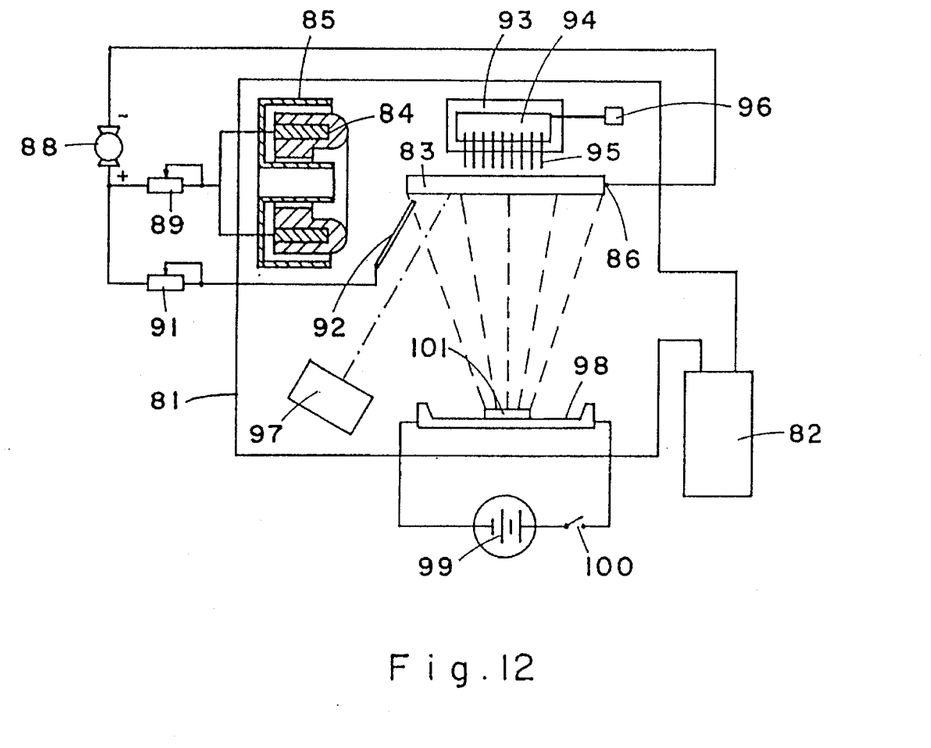
FIG. 12 is a schematic representation of apparatus in accordance with the present invention, for the cleaning and coating of an object.

As seen in FIG. 12, an enclosure 81 is coupled to a vacuum pump 82, thereby ensuring the creation of a vacuum in the enclosure having a low gas pressure capable of sustaining a vacuum arc discharge. An elongated object 83 whose surface is to be cleaned and coated is supported, by means not shown, within the enclosure 81 and is provided with means (not shown) for the translational displacement thereof along its longitudinal axis and for the rotation thereof about its longitudinal axis. The elongated object 83 is coaxial with a central bore of an annular anode 84 provided with suitable screening 85. The object 83 which constitutes an effective cathode is electrically connected at contact 86 to the negative pole of a voltage source 88. The positive pole of the voltage source 88 is connected, on the one hand, via a resistor 89 to the anode 84 and, on the other hand, and in parallel, via a resistor 91 to an auxiliary trigger electrode 92. Juxtaposed with respect to the object 83 is an insulated metal body 93 in which is located a replaceable unit 94 from which depend conductive teeth 95. The body 93 is associated with drive means 96 by means of which the body can be displaced along the surface of the object 83.

Located within the enclosure 81 and directed towards the object 83 is a source 97 of electromagnetic radiation, for example a laser source, from which a beam of electromagnetic radiation can be directed onto a restricted surface area of the object 83 adjacent the anode 84.

Located within the enclosure 81 directly below the object 83 is a vaporizer 98 coupled to a voltage source 99 via a switch 100 and on which is located a vaporizable element 101 constituted by the material to be vaporized and to form the coating on the object 83. Vaporization of the element 101 takes place as a result of the resistive heating of the vaporizer 98 upon closing the switch 100.

In operation, the object 83 is longitudinally displaced into the vicinity of the anode 84 and a restricted surface area thereof is irradiated from the radiation source 97, thereby heating this surface area and giving rise to a limited vaporization thereof and/or thermionic emission therefrom. The vaporized layer becomes ionized under the influence of the radiation. The generation of ions in the region of the restricted surface area and/or the thermionic emission serve to attract the arc discharge thereto. The use of the electromagnetic beam of radiation for this purpose is only necessary in the initial stages of the production of the arc discharge, after which the radiation can be switched off. The arc is maintained in the restricted surface area and in subsequent restricted surface areas, by virtue of the fact that the conductive teeth of the insulating body are located in contact with these areas, thereby ensuring that the arc discharge continues to be directed to the relevant restricted areas.

The elongated object 83 can thereupon be cleaned by being subjected along its entire length and periphery to the effect of the arc discharge, which successively treats successive restricted surface areas thereof. The cleaning treatment by the arc discharge can be supplemented or completed by mechanical cleaning by the teeth 95. It will be realized that, as in the previously described cases, the main treatment is effected by the arc discharge acting on the successive restricted areas, and this by virtue of the LS cathode spots active in these areas. Auxiliary preliminary treatment is effected by virtue of the fact that the SF cathode spots are directed towards the contact 86, thereby providing preliminary cleaning of the object which is then completed by means of the main arc discharge.

The provision of the additional mechanical cleaning is of particular importance in view of the following circumstances. The movement of the SF cathode spots towards the contact 86 creates elongated clean paths having widths which compare with the mean widths of the SF cathode spots and lie in the range of 0.3 to 1 mm. Bounding these paths are effective raised ridges of contaminants, scale or the like and the existence of these ridges tends to impede the effective cleaning of the surface by the following LS cathode spots. In point of fact, the presence of these ridges can give rise, upon the passage of the LS spots, to non-uniform, undesirable fusing of the paths already cleaned by the SF cathode spots. If, however, these regions, which have already been subjected to the preliminary cleaning action of the SF cathode spots, are subjected to mechanical cleaning by the teeth which can easily remove them, then the subsequent passage thereover of the LS cathode spots is effective in uniformly cleaning the surface without any undue danger of fusion.

Furthermore, by ensuring that the teeth 95 of the insulated body 93 are spaced from each other by between about 0.5–5 mm, these elements can serve as virtual traps for the cathode spots which are caused to discharge between the elements, and in this way the mechanical cleaning of the object is accompanied by an improved electrical cleaning thereof.

With the completion of the cleaning of the object 83, the latter can be subjected to thermal treatment by the action of the same arc discharge, this thermal treatment resulting in the strengthening of the surface of the object 83 and controlling its surface characteristics.

Simultaneously with, or intermittently with, the thermal treatment of the object 83, the latter can now be coated by the resistive heating of the vaporizer 98 (by closing the switch 100), as a result of which the vapor source 101 is vaporized and vapor is deposited on the object 83 which is rotated about its longitudinal axis. Where the thermal treatment is carried out simultaneously with the vaporization, it is possible to produce a high quality coating layer, characterized by an increased adhesion of the coating layer to the metal surface.

The coating of the object 83 can be carried out simultaneously or intermittently with a mechanical treatment of the coating by means of suitable teeth. For this purpose, the teeth should either be formed of the same material as the coating or of the same material as the object to be coated.

It will be appreciated that where relatively thick coatings are to be deposited on the object 83, the process described above, namely thermal treatment and deposition of initial coatings, followed by subsequent thermal treatment and deposition of coatings, can be repeated sufficient times to produce the required thickness of coating.

During the thermal treatment of the object, it is important to ensure that the object does not reach a temperature higher than the annealing temperature thereof, and for this purpose, the object can be coupled to a thermocouple, which can be employed to control the degree of heating. Furthermore, during the coating of the object, the application of the coating can be controlled by the interposition, as desired, between the vaporizer and the object, of a removable screen.

Figure 13:
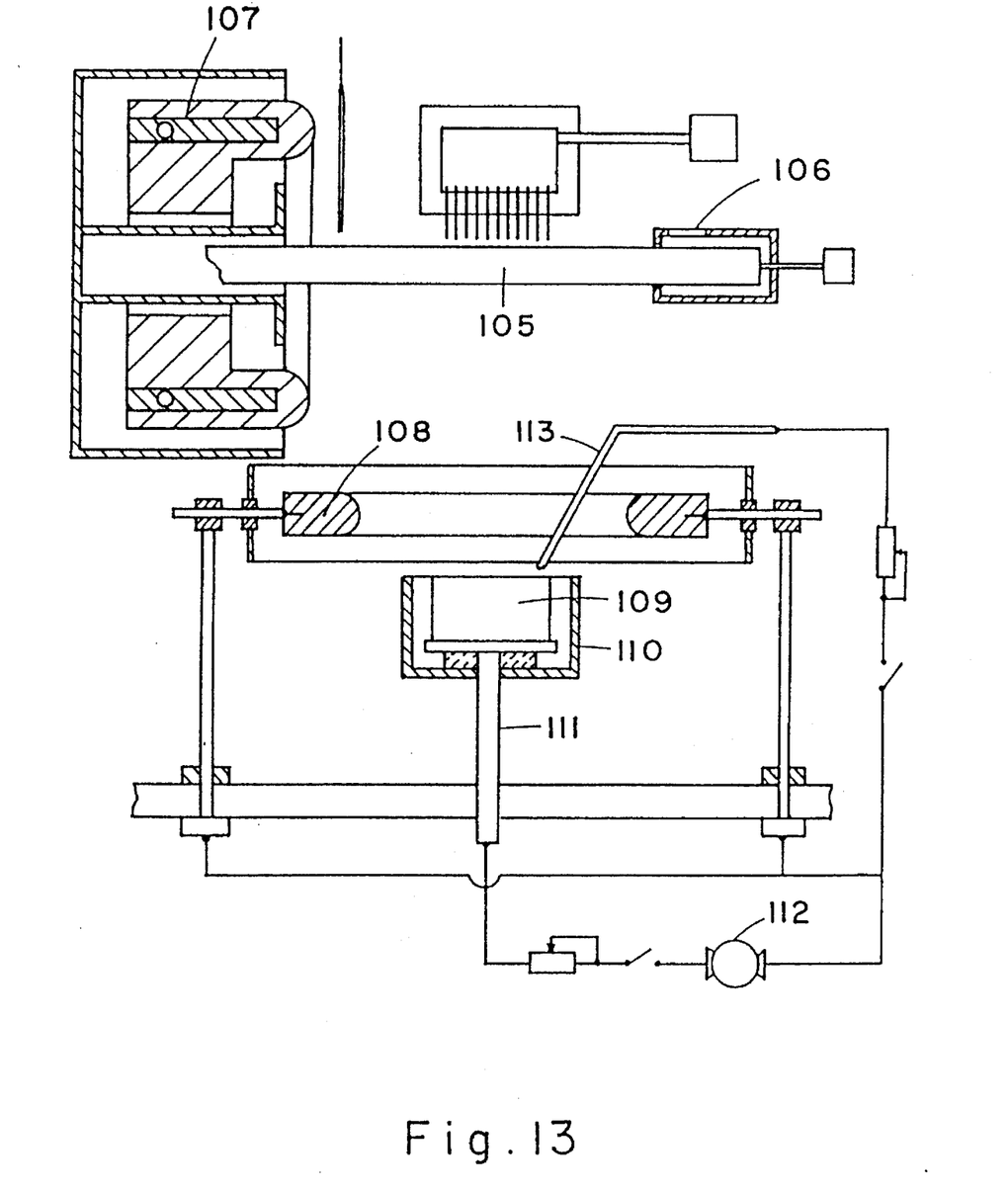
FIG. 13 is a schematic representation of a further form of apparatus for cleaning and coating an object, utilizing arc discharges for both purposes.

Whilst in the embodiment described above with reference to FIG. 12 of the drawings vaporization takes place as a result of the electrical resistive heating of the vaporizer 98, in accordance with a further embodiment of the present invention vaporization is effected by subjecting the vaporizing element to a vacuum arc discharge. Such an embodiment is schematically shown in FIG. 13 of the drawings.

As seen in this figure, an object 105 is coupled to a voltage source (not shown). The right-hand end of the object 105 is enclosed within a screen 106 which serves to limit the electric discharge and is provided with slots (not shown). In addition, however, to the provision of an anode 107 between which and the object 105 the arc discharge is created for the purpose of cleaning, in the present embodiment an additional annular anode 108 is provided which is juxtaposed with respect to a vaporizing element 109 located within a vaporizer 110 and provided with an electrical conductor 111 which is coupled to a negative pole of a voltage source 112, the positive pole of which is electrically connected to the anode 108. In this way, the vaporizing element 109 constitutes a cathode and when a discharge is initiated (originally with an auxiliary trigger electrode 113) between the anode 108 and a restricted surface area of the vaporizing element 109 opposite the conductor 111, vaporization takes place with the resultant coating of the object 105.

Figure 14A:
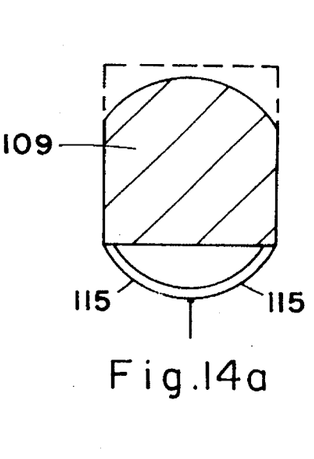
FIGS. 14a, 14b and 14c show schematically the effect on a vaporizing element of differing applications of an arc discharge.
Figure 14B:
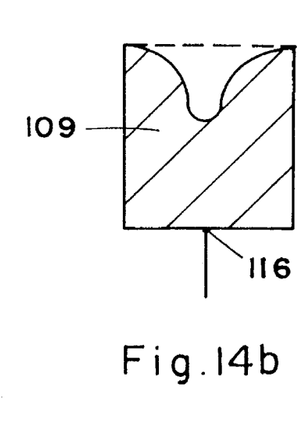
Figure 14C:
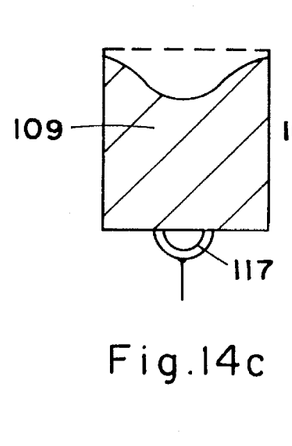

The advantages of ensuring vaporization by means of an arc discharge which operates on a restricted surface area of the vaporizing element 109, are illustrated in FIG. 14 of the drawings. Thus, in FIG. 14a, the negative voltage is applied to the vaporizing element 109 via a pair of conductors 115 which contact the lower extremities of the element and, as a consequence, it can be seen that, as a result of the cathode spots on the vaporizing surface moving to the corresponding upper extremities, vaporization takes place non-uniformly. Where, as in the situation shown in FIG. 14b, the negative voltage is provided to a narrow contact 116 located centrally, a similarly undesirable form of vaporization takes place. Where, however, as shown in FIG. 14c of the drawings, the negative voltage is provided to the base of the vaporizing element via a ring contact 117 which defines a restricted surface area, then the provision of a corresponding restricted surface area on the upper portion of the vaporizing element leads to a relatively uniform vaporization.

Whilst in the arrangements described above treatment of the surface of a metal object serving as a cathode has been effected using a single anode, it is possible in suitable cases to increase the efficiency of treatment by employing a plurality of anodes having common or separate power sources. In this way, the object is treated by a plurality of arc discharges.

Figure 15:
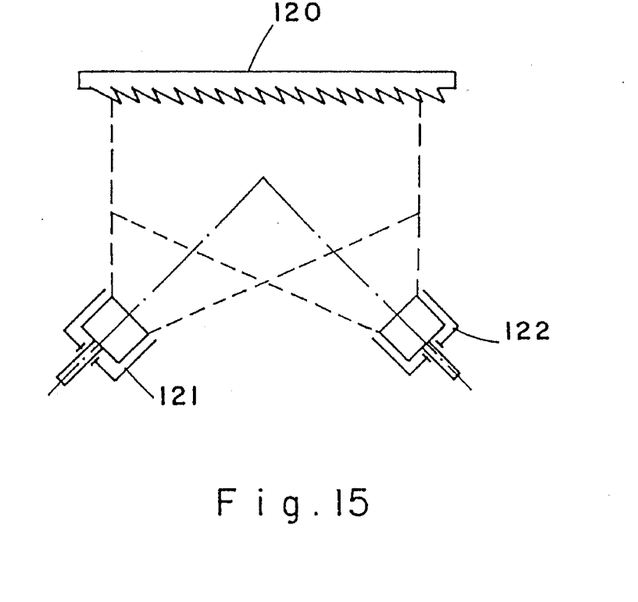
FIG. 15 is a schematic representation of a portion of an apparatus in accordance with the present invention, for the coating of an irregularly shaped object.

FIG. 15 illustrates the coating by vaporization of an irregularly-shaped object 120 such as, for example, a ratchet. For this purpose, two vaporizers 121, 122 are positioned below the object 120 and are directed towards the object 120 in respectively oppositely-angled directions so that their vaporizing beams overlap and coat the object 120 in opposite directions. In this way it is ensured that the object 120 is uniformly coated, despite its irregular shape.

It will be understood that in all the embodiments in accordance with the invention the arc discharges are maintained in a stable regime for as long as is necessary.

I claim:

1. Apparatus for the surface treatment of a metal workpiece comprising an enclosure; means for generating a vacuum in said enclosure; first means for controlled introduction of gas into said enclosure; at least one anode; second means for displaceably supporting said workpiece constituting a cathode in said enclosure; third means for applying an arc generating voltage between said anode and said cathode; fourth means for restricting said arc discharge to successive restricted areas of a first surface of said workpiece; fifth means for ensuring a substantially uniform arc distribution on said anode; and sixth means for effecting a relative displacement between said workpiece and said anode in a given direction.

2. Apparatus according to claim 1, wherein said fourth means is designed to establish low resistance zones in the region of said restricted areas.

3. Apparatus according to claim 2, wherein said fourth means comprise one or more contacts applied to a second and opposite surface of said workpiece so as to define second surface portions respectively opposite and coextensive with said restricted areas.

4. Apparatus according to claim 2, wherein said fourth means comprise cooling means for successively cooling regions of said workpiece so as to form said restricted areas.

5. Apparatus according to claim 1, wherein said fourth means comprises electromagnetic irradiation means for successively irradiating said restricted areas.

6. Apparatus according to claim 1, wherein said fourth means comprises an electrically insulated body having elements thereof in successive electrical contact with said restricted areas.

7. Apparatus according to claim 1, wherein there are furthermore provided at least one auxiliary contact in electrical contact with a second surface at positions thereof downstream with respect to a desired relative movement of the arc discharge with respect to the workpiece.

8. Apparatus according to claim 1, wherein there is furthermore provided a vaporizing electrode juxtaposed with respect to said workpiece; seventh means for heating said vaporizing electrode so as to give rise to the vaporization thereof.

9. Apparatus according to claim 8, wherein said seventh means comprises electric resistance heating means.

10. Apparatus according to claim 8, wherein said seventh means comprises an additional arc discharge means utilizing said vaporizing electrode as an auxiliary cathode and provided with at least one auxiliary anode.

11. Apparatus in accordance with claim 1, wherein said fifth means comprises an anode formed of outer and inner bodies in close electrical contact, said inner body having a higher electrical conductivity than said outer body, means for applying said arc voltage between said workpiece and said inner body, said arc discharge being generated between said outer body and a restricted area of said workpiece.

12. Apparatus in accordance with claim 11, wherein said outer and inner bodies are substantially coaxial and cylindrical, means being provided for imparting a continuous or intermittent rotational displacement to said anode.

13. Apparatus in accordance with claim 12, and furthermore provided with scraper means adapted to bear on an external surface of said outer body so as to detach therefrom material deposited thereon.

14. Apparatus for the treatment of an inner surface of a cylindrical metal workpiece comprising means for establishing a vacuum in said workpiece; an anode displaceable within and along a length of said workpiece, electric contacts in contact with an external surface of said workpiece and displaceable with respect to said workpiece in synchronism with said anode; and means for passing gas through said workpiece in a direction of displacement of said anode so as to establish a gas pressure gradient in said direction.

15. Apparatus for the treatment of an inner surface of a cylindrical metal object comprising:

means for establishing a vacuum in said object;

means for displacing an anode through said object in a predetermined direction;

means for displacing cathode contacts in contact with said object in synchronism with the displacement of said anode; and means for establishing a gas flow through said object in the direction of said displacement so as to establish a gas pressure gradient in said direction.

\* \* \* \* \*